AUTOMATIC VOLUME CONTROL CIRCUITS INCLUDING TRANSISTORS
Original Filed April 28, 1955
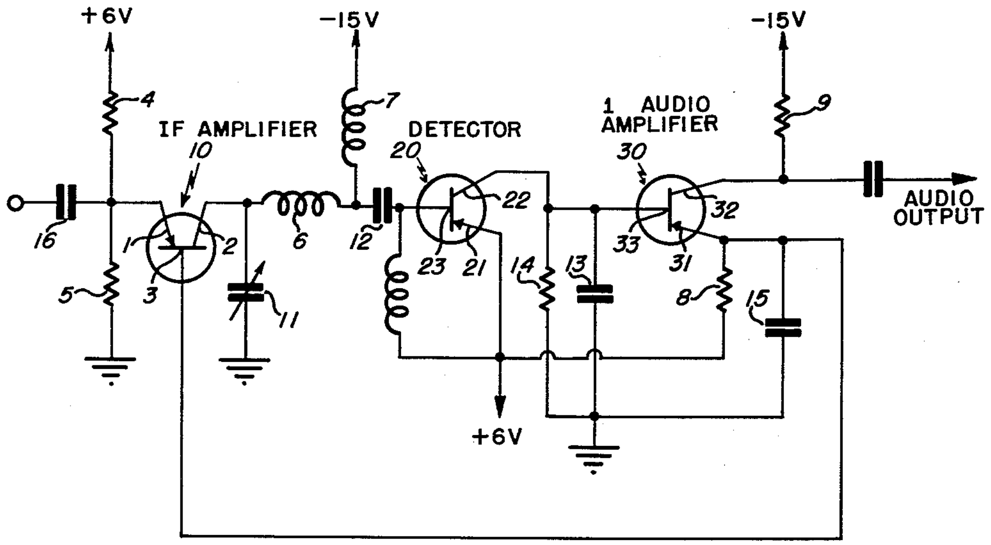
INVENTOR
SUMNER RICEMAN
BY H. Vincent Harsha
ATTORNEY United States Patent Office 3,012,137
Patented Dec. 5, 1961

3,012,137

AUTOMATIC VOLUME CONTROL CIRCUITS INCLUDING TRANSISTORS

Sumner Riceman, Newton Centre, Mass., assignor to Raytheon Company, a corporation of Delaware Continuation of application Ser. No. 504,587, Apr. 28, 1955. This application Apr. 3, 1959, Ser. No. 803,985
6 Claims. (Cl. 250—20)

This application is a continuation of my prior copending application, Serial No. 504,587, filed April 28, 1955, now abandoned, and assigned to the same assignee as the present application.

This invention relates generally to electrical circuits, including transistors, and more particularly to a novel automatic volume control circuit for use with a transistor amplifier.

Transistors comprise, in general, a body of semiconductive material, such as germanium, having three connections thereto designated as the emitter, base, and collector. In one manner of operation, signals may be impressed between the emitter and base, and amplified replicas of these signals may be obtained in a load connected between the emitter and the collector. As is known, either current or voltage gains, or both, can thus be realized.

The many advantages offered by the use of transistors have led to an increasing emphasis being placed on the development of circuit arrangements to most efficiently incorporate these desirable characteristics, one of the major fields of endeavor being that of radio and associated circuitry. In the past, various radio circuits have been advanced, including means for obtaining an automatic volume control voltage. However, in all these arrangements considerable difficulty has been encountered in obtaining an adequate control voltage without sacrificing overall gain, and including in the circuit an undesirably large number of components which tend to defeat the advantage of compactness of size otherwise attainable. Accordingly, the present invention is directed toward a novel transistor amplifier circuit capable of use, for example, in a portable radio receiver, wherein a plurality of transistors are employed as the various stages, and an automatic volume control voltage may be derived from the emitter of the audio amplifier and fed directly to the intermediate frequency amplifier without the use of undesirable intervening components.

The invention will be better understood as the following description proceeds taken in conjunction with the accompanying drawing wherein the single figure is a schematic diagram of the amplifier circuit in accordance with the present invention.

Referring now to the drawing, there is shown in the single figure a portion of a radio circuit comprising an intermediate frequency amplifier stage, a detector stage, and a first audio amplifier stage. As shown, the IF amplifier may be a transistor, designated generally at 10, having an emitter electrode 1, a collector electrode 2, and a base electrode 3. The detector stage may also be a transistor 20 having an emitter 21, a collector 22, and a base 23, while the audio amplifier stage similarly may comprise a transistor 30 having an associted emitter 31, collector 32, and base 33. In order to supply suitable biasing potentials to transistor 10, it has its emitter 1 connected to the positive side of a source of direct current potential, which may be a six-volt battery, for example, through a voltage divider network comprising resistors 4 and 5, and has its collector 2 connected to a source of negative direct current potential through coils 6 and 7. Similarly, emitter 21 of transistor 20 is connected directly to a source of positive voltage, such as a six-volt battery, while emitter 31 of transistor 30 is connected to the same source through resistor 8, and collector 32 is connected to a negative potential through resistor 9. Although the transistors 10, 20 and 30 have been shown as being of the so-called PNP type, it should be understood that NPN transistors may also be used, thus necessitating only a reversal of the biasing polarities.

Collector 2 of transistor 10 is connected to base 23 of transistor 20 through an intermediate frequency tuning network comprising coil 6 and variable capacitor 11, and a coupling condenser 12. Collector 22 of transistor 20 is direct current coupled to the base 33 of transistor 30 which is bypassed at radio frequencies by condenser 13. A load resistor 14 has one end connected to collector 22, and has its other end grounded. Emitter 31 of transistor 30 is bypassed at audio and radio frequencies by condenser 15, and is also connected directly to the base 3 of the IF amplifier stage, comprising transistor 10, to provide an automatic volume control voltage responsive to the strength of an applied signal.

In operation, an incoming alternating current signal is fed to the emitter 1 through condenser 16, and after amplification in the IF stage is applied to the base 23 of transistor 20. Transistor 20, which is biased to be normally nonconducting, will conduct on the negative swing of the alternating current signal which causes base 23 to become negative with respect to emitter 21, and a current flow will occur in load resistor 14 in a direction which will make the upper end of resistor 14 positive with respect to ground, thus driving base 33 of transistor 30 positive, which tends to reduce current flow through transistor 30. As a result, emitter 31 of transistor 30 will draw less current through resistor 8, thus driving the emitter positive an amount to compensate for the signal voltage being applied to base 33. This voltage is, in turn, fed directly to the base 3 of transistor 10, thus reducing the amount of current flow through transistor 10 due to the applied signal, and automatically controlling the intensity of the audio output.

It can thus be seen that a relatively simple method of deriving an automatic volume control voltage for a transistor amplifier has been provided which requires no extra components, the direct coupling between detector and audio stages eliminating several components that would otherwise be necessary.

Although there has been shown what is considered to be a preferred embodiment of the present invention, various adaptions and modifications thereof may be made without departing from the spirit and scope of the invention as defined in the appended claims.

What is claimed is:

1. An electrical circuit comprising an intermediate frequency stage transistor, means for applying an input signal to said intermediate frequency stage, a detector stage connected to said intermediate frequency transistor, an audio frequency stage transistor direct circuit coupled to said detector by a direct connection which includes only a conducting lead, and means directly connecting said audio stage transistor to said intermediate stage transistor for feeding a voltage responsive to the strength of said input signal from said audio stage transistor back to said intermediate stage transistor.

2. A circuit as set forth in claim 1 wherein said detector stage comprises a semiconductive device.

3. A circuit as set forth in claim 1 wherein said detector stage comprises a transistor.

4. An automatic volume control circuit comprising a first transistor having at least an emitter electrode, a collector electrode, and a base electrode, said first transistor being adapted to amplify an input alternating current signal, means for applying said input signal to said first transistor, means adapted to detect audio frequency modulation in said input signal including a second transistor also having at least emitter, collector and base electrodes, said second transistor being connected to said first transistor, a third transistor also having emitter, collector and base electrodes, and being adapted to amplify said detected audio frequency intelligence, the base of said third transistor being directly connected to the collector of said second transistor solely by means capable of passing a direct current, and means directly connecting the emitter of said third transistor with the base of said first transistor for applying a voltage responsive to the strength of said input signal directly to the base of said first transistor.

5. An automatic volume control circuit comprising an intermediate frequency stage transistor having at least an emitter electrode, a collector electrode and a base electrode, means for applying an input signal to said intermediate frequency stage transistor, means adapted to detect audio frequency intelligence in said input signal comprising a second transistor also having at least emitter, collector and base electrodes, said second transistor being connected to said intermediate frequency stage transistor, an audio frequency stage transistor also having emitter, collector and base electrodes and being adapted to amplify said detected audio frequency intelligence, said audio frequency stage transistor being direct current coupled to said second transistor by a direct connection which includes only a conducting lead, and means connecting the emitter of said audio frequency stage transistor to said intermediate frequency stage transistor for feeding a voltage responsive to the strength of said input signal directly back to said intermediate frequency stage transistor.

6. An automatic volume control circuit comprising an intermediate frequency stage transistor having at least an emitter electrode, a collector electrode and a base electrode, means for applying an input signal to said intermediate frequency stage transistor, means adapted to detect audio frequency intelligence in said input signal comprising a second transistor also having at least emitter, collector and base electrodes, said second transistor being connected to said intermediate frequency stage transistor, an audio frequency stage transistor also having emitter, collector and base electrodes and being adapted to amplify said detected audio frequency intelligence, said audio frequency stage transistor being direct current coupled to said second transistor by a direct connection which includes only a conducting lead, and means connecting the emitter of said audio frequency stage transistor to the base of said intermediate frequency stage transistor for feeding a voltage responsive to the strength of said input signal directly back to the base of said intermediate frequency stage transistor.

References Cited in the file of this patent

UNITED STATES PATENTS

| | | |
|---|---|---|
| 2,761,916 | Barton | Sept. 4, 1956 |
| 2,789,164 | Stanley | Apr. 16, 1957 |
| 2,797,258 | Denton | June 25, 1957 |
| 2,809,240 | Freedman | Oct. 8, 1957 |
| 2,841,702 | Barton | July 1, 1958 |
| 2,864,888 | Goodrich | Dec. 16, 1958 |
| 2,866,892 | Barton | Dec. 30, 1958 |
| 2,885,544 | Radcliffe | May 5, 1959 |

OTHER REFERENCES

Article: "An Experimental Transistor Personal Broadcast Receiver" by Barton; Institute of Radio Engineers Transactions on Broadcast and Television Receivers; January 1954, pages 6 to 13.

Article by Stem and Raper entitled "Transistor AM Broadcast Receivers" in Institute of Radio Engineers convention record, March 22–25, 1954, part 7, pages 8 to 14 (first distributed June 23, 1954).

Article in "Electronic Design" entitled "Miniature Transistor Radio," December 1954, pages 20 and 21.

UNITED STATES PATENT OFFICE

CERTIFICATION OF CORRECTION

Patent No. 3,012,137 December 5, 1961

Sumner Riceman

It is hereby certified that error appears in the above numbered patent requiring correction and that the said Letters Patent should read as corrected below.

Column 1, line 60, for "associted" read -- associated --; column 2, line 52, for "circuit" read -- current --.

Signed and sealed this 17th day of April 1962.

(SEAL)
Attest:

ESTON G. JOHNSON
Attesting Officer

DAVID L. LADD
Commissioner of Patents